(12) United States Patent
Boyle

(10) Patent No.: US 7,043,285 B2
(45) Date of Patent: May 9, 2006

(54) WIRELESS TERMINAL WITH DUAL BAND ANTENNA ARRANGEMENT AND RF MODULE FOR USE WITH DUAL BAND ANTENNA ARRANGEMENT

(75) Inventor: Kevin R. Boyle, Horsham (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/512,735

(22) PCT Filed: Apr. 25, 2003

(86) PCT No.: PCT/IB03/01704

§ 371 (c)(1),
(2), (4) Date: Oct. 27, 2004

(87) PCT Pub. No.: WO03/094346

PCT Pub. Date: Nov. 13, 2003

(65) Prior Publication Data

US 2005/0181847 A1 Aug. 18, 2005

(30) Foreign Application Priority Data

May 1, 2002 (GB) .................................... 0209959

(51) Int. Cl.
H04M 1/00 (2006.01)

(52) U.S. Cl. .................................................. 455/575.7

(58) Field of Classification Search ............. 455/575.7, 455/575.1, 550.1
See application file for complete search history.

Primary Examiner—William D. Cumming
(74) Attorney, Agent, or Firm—Aaron Waxler

(57) ABSTRACT

A wireless terminal having a dual band antenna arrangement which comprises a planar inverted-F antenna (10) having a first (12) for signals in a first, lower frequency band, for example the GSM band, a second feed (14) for signals in a second, higher frequency band, for example the DCS band, and a ground pin (16). A first coupling stage (26A) couples the transmit and receive paths of a first transceiver (GSM) to the first feed and a second coupling stage (26B) couples the transmit and receive paths of a second transceiver (DCS) to the second feed. Each of the first and second coupling stages comprise a quarter wavelength transmission line (50A, 50B) having a first end coupled to the respective transmit signal path and a second end coupled by band pass filter (52A, 52B) to the respective receive signal path. A first PIN diode (D1, D3) couples a transmit signal path to the first end of the respective quarter wavelength transmission line and to the respective feed (12, 14) and a second PIN diode (D2, D4) second end of the respective quarter wavelength transmission line to ground. In operation when transmitting in one of the bands, the first and second PIN diodes of the relevant coupling stage are switched-on, whilst the PIN diodes in the other coupling stage are off and when in a receiving mode all the PIN diodes are off. The signal being received by one of the transceivers is reflected by the band pass filter in the coupling stage of the other transceiver.

10 Claims, 9 Drawing Sheets

WIRELESS TERMINAL WITH DUAL BAND ANTENNA ARRANGEMENT AND RF MODULE FOR USE WITH DUAL BAND ANTENNA ARRANGEMENT

TECHNICAL FIELD

The present invention relates to wireless terminal, for example a cellular telephone, having a dual-band antenna arrangement comprising a substantially planar patch antenna, and to a module incorporating such an arrangement. In the present specification, the term dual-band antenna relates to an antenna which functions satisfactorily in two (or more) separate frequency bands but not in the unused spectrum between the bands.

BACKGROUND ART

Wireless terminals, such as mobile phone handsets, typically incorporate either an external antenna, such as a normal mode helix or meander line antenna, or an internal antenna, such as a Planar Inverted-F Antenna (PIFA) or similar.

Such antennas are small (relative to a wavelength) and therefore, owing to the fundamental limits of small antennas, narrowband. However, cellular radio communication systems typically have a fractional bandwidth of 10% or more. To achieve such a bandwidth from a PIFA for example requires a considerable volume, there being a direct relationship between the bandwidth of a patch antenna and its volume, but such a volume is not readily available with the current trends towards small handsets. Further, PIFAs become reactive at resonance as the patch height is increased, which is necessary to improve bandwidth.

U.S. Pat. No. 6,061,024 discloses a duplexing antenna for a single band, for example 800 to 900 MHz, portable radio transceiver in which the antenna comprises respective PIFA transmit and receive antennas formed as patches on a printed circuit board mounted above and facing a reference ground plane of a circuit board on which the transmitter and receiver components are mounted. Separate feeds interconnect an output bandpass filter of the transmitter and an input bandpass filter of the receiver with their respective patch antenna. An electrically conductive pedestal connects the reference ground plane to an elongate area of the printed circuit extending between the patches. Both the transmit and receive antennas are narrow band, say 1.6 MHz, antennas which are tunable over a wider bandwidth, say 25 MHz, by coupling reactive components, that is capacitances or inductances, to the respective antennas using PIN diode switches.

Our pending unpublished PCT Patent Application IB02/05031 (Applicant's reference PHGB 010194) discloses a wireless terminal having a dual band PIFA comprising a substantially planar patch conductor. A first feed conductor comprises a first feed pin connected to the patch conductor at a first point, a second feed conductor comprises a second feed pin connected to the patch conductor at a second point, and a ground conductor comprises a ground pin connected between a third point on the patch conductor and a ground plane. The feed and ground pins may have different cross-sectional areas to provide an impedance transformation. First and second transmission lines are formed by the ground conductor and a respective one of the feed conductors. The first and second transmission lines are short circuit transmission lines whose respective lengths are defined by a first linking conductor connecting the first feed and ground pins and a second linking conductor connecting the second feed and ground pins. Complementary circuit elements comprising first and second shunt capacitance means are coupled respectively between the first and second feed pins and the ground pin. The described antenna is fed by a diplexer to provide isolation between say GSM circuitry operating over a frequency band 880 to 960 MHz and DCS circuitry operating over a frequency band of 1710 to 1880 MHz. The provision of a diplexer although enabling the cited antenna arrangement to work satisfactorily represents an undesired complication.

DISCLOSURE OF INVENTION

An object of the present invention is to simplify the architecture of a wireless terminal.

According to a first aspect of the present invention there is provided a wireless terminal having a dual band antenna arrangement comprising an antenna having a first feed for signals in a first, lower frequency band, a second feed for signals in a second, higher frequency band and a ground pin, first coupling means for coupling transmit and receive paths of a first transceiver to the first feed, second coupling means for coupling transmit and receive paths of a second transceiver to the second feed, each of the first and second coupling means comprising a quarter wavelength transmission line having a first end coupled to the respective transmit signal path and a second end coupled by bandpass filtering means to the respective receive signal path, a first switching device coupling a transmit signal path to the first end of the respective quarter wavelength transmission line, a second switching device coupling the second end of the respective quarter wavelength transmission line to ground, and means for switching-on the first and second switching devices of one of the first and second coupling means when in a transmit mode and for switching-off the first and second switching devices when in a is receive mode, the first and second switching devices of the other of the first and second coupling means being non-conductive.

According to a second aspect of the present invention there is provided an RF module for use with a dual band antenna arrangement, the RF module comprising a first antenna feed for signals in a first, lower frequency band, a second antenna feed for signals in a second, higher frequency band and a ground pin, first coupling means for coupling transmit and receive paths of a first transceiver to the first feed, second coupling means for coupling transmit and receive paths of a second transceiver to the second feed, each of the first and second coupling means comprising a quarter wavelength transmission line having a first end coupled to the respective transmit signal path and a second end coupled by bandpass filtering means to the respective receive signal path, a first switching device coupling a transmit signal path to the first end of the respective quarter wavelength transmission line, a second switching device coupling the second end of the respective quarter wavelength transmission line to ground, and means for switching-on the first and second switching devices of one of the first and second coupling means when in a transmit mode and for switching-off the first and second switching devices when in a receive mode, the first and second switching devices of the other of the first and second coupling means being non-conductive.

According to a third aspect of the present invention there is provided a combination of a RF module made in accordance with the second aspect of the present invention and an antenna having means for connection to the first and second feeds and the ground pin.

The antenna may comprise a patch antenna such as a PIFA (planar inverted-F antenna).

The ground pin may be disposed between, and insulated from, the first and second feeds.

The first and second switching devices may comprise any suitable RF switching devices such as PIN diodes.

BRIEF DESCRIPTION OF DRAWINGS

The present invention will now be described, by way of example, with is reference to the accompanying drawings, wherein.

In the drawings the same reference numerals have been used to indicate corresponding features.

MODES FOR CARRYING OUT THE INVENTION

Figure 1:
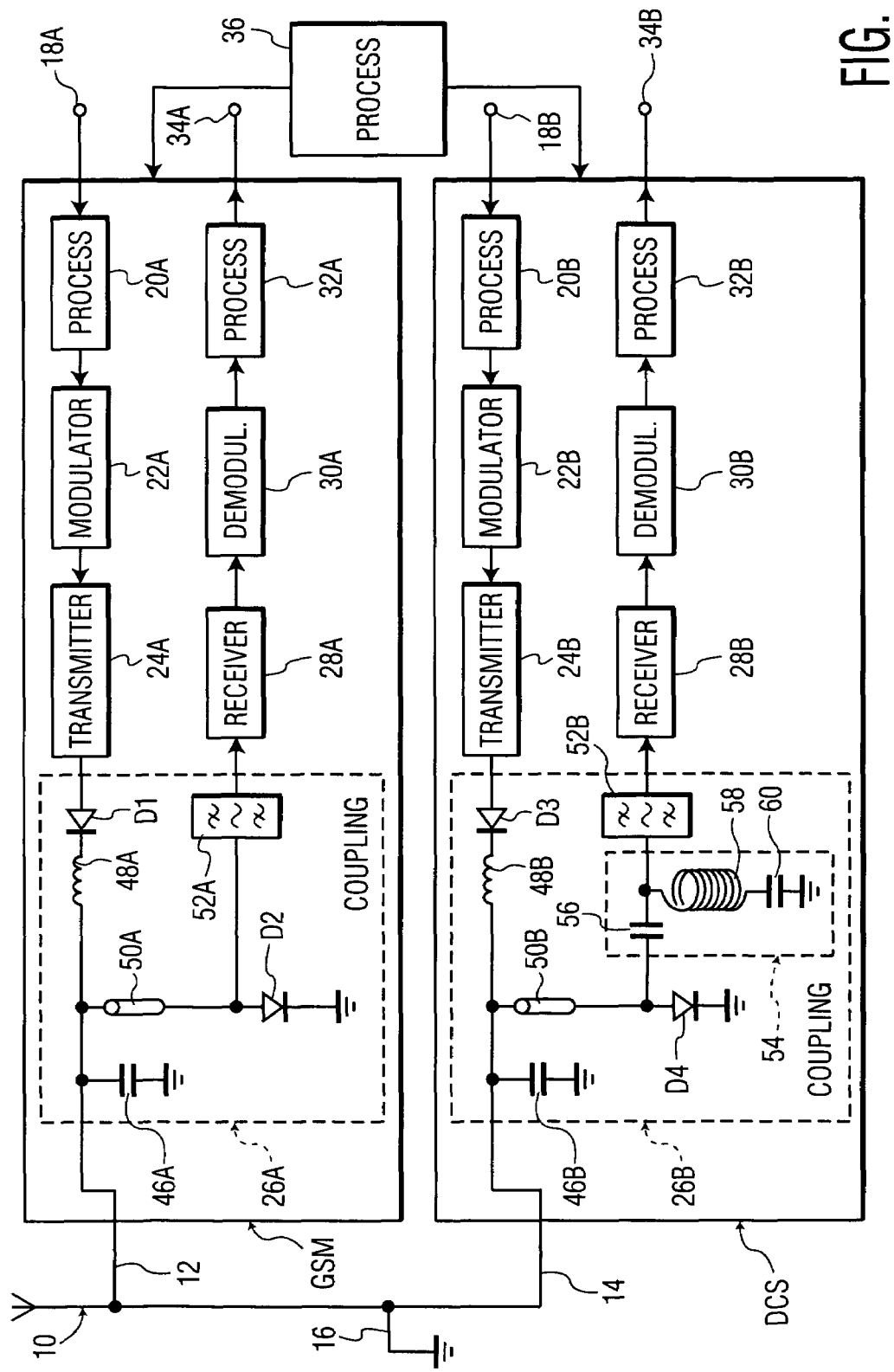
FIG. 1 is a block schematic diagram of an embodiment of a wireless terminal made in accordance with the present invention.
Figure 2:
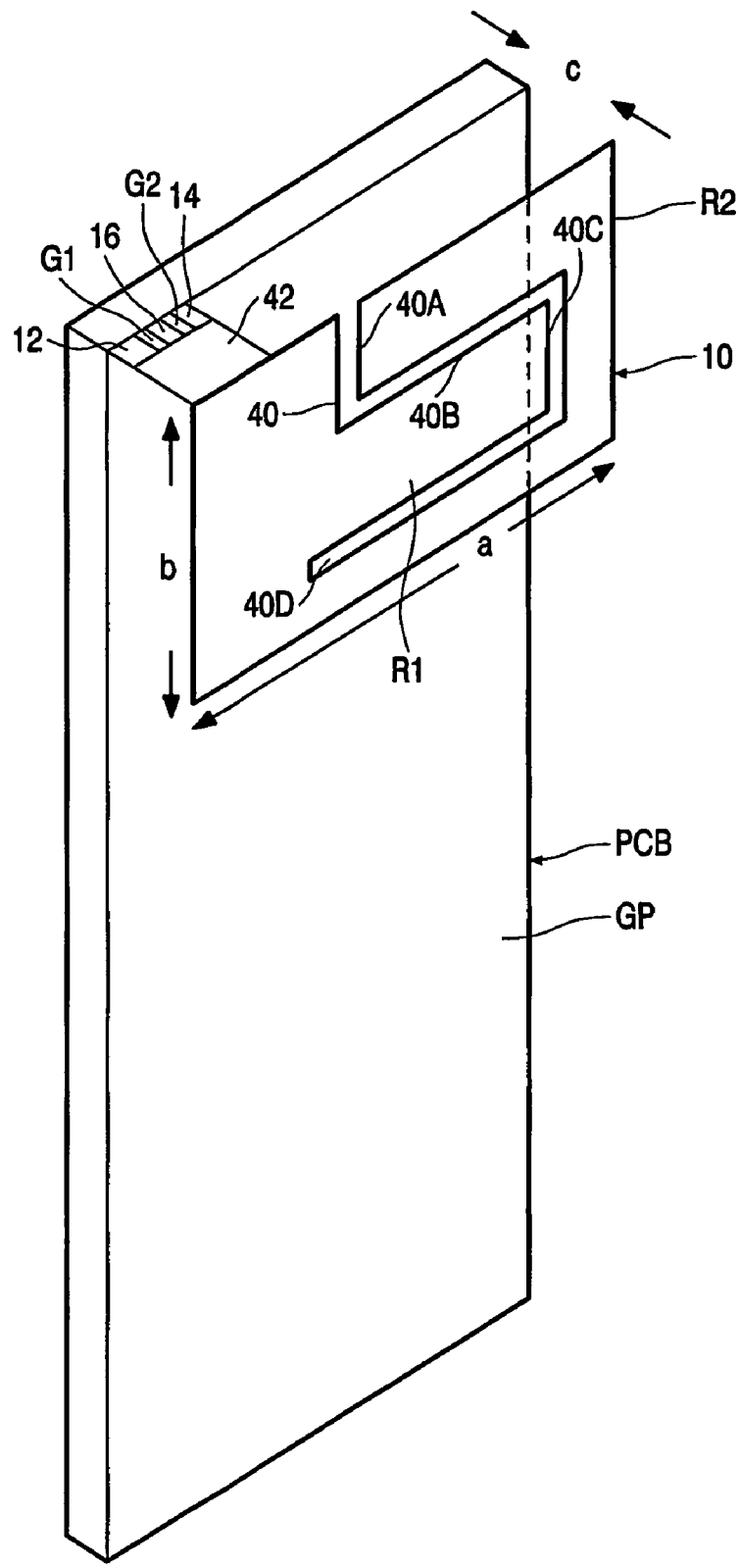
FIG. 2 is a diagram of a circuit board having a PIFA and transmitting and receiving filters.

Referring to FIG. 1, the wireless terminal comprises a PIFA antenna 10 having feeds 12 and 14 to which are connected a GSM transceiver which operates in a frequency band of 880 to 960 MHz and a DCS transceiver which operates in the frequency band 1710 to 1880 MHz, respectively. A ground pin 16 is provided between the feeds 12, 14 as shown in FIG. 2 to be described later. As the architectures of the GSM and the DCS transceivers are generally the same the corresponding stages will be referenced with the suffices A and B respectively and in the interests of brevity only the GSM transceiver will be described. The transmitter section of the GSM transceiver comprises a signal input terminal 18A coupled to an input signal processing stage 20A. The stage 20A is coupled to a modulator 22A which provides a modulated signal to a transmitter stage 24A which includes a frequency up-converter, power amplifier and any relevant filters. A common coupling stage 26A couples the transmitter stage to the antenna feed 12. The common coupling stages 26A and 26B will be described in greater detail later. The coupling stage 26A is also coupled to a receiver section 28A of the GSM transceiver to the feed 10. The receiver section 28A includes a low noise amplifier, a frequency down-converter and filters. An output of the receiver section 28A is demodulated in a demodulator 30A and its output is applied to a signal processing stage 32A which provides an output signal on a terminal 34A. The operation of both of the transceivers is controlled by a processor 36.

Referring to FIG. 2, a printed circuit board PCB has components (not shown) on one side and a ground plane GP on the reverse side. A PIFA 10 is mounted on, or carried by, the PCB. The PIFA can be implemented in several alternative ways, for example as a preformed metal plate carried by the PCB using posts of an insulating material, as a pre-etched piece of printed circuit board carried by the PCB, as a block of insulating material having the PIFA formed by selectively etching a conductive layer provided on the insulating material or by selectively printing a conductive layer on the insulating block or as an antenna on the cell phone case. For use at GSM and DCS frequencies, the dimensions of the PIFA 10 are length (dimension "a") 40 mm, height (dimension "b") 8 mm and depth (dimension "c") 4 mm. The planar conductor or conductive layer incorporates a slot 40 comprising four interconnected rectilinear sections 40A to 40D having an overall shape approximating to an inverted question mark without the dot. The section 40A which opens into the top edge of the PIFA 10 is wider than the sections 40B to 40D which have substantially the same width. The slot 40 can be considered as dividing the planar conductor into two antennas connected to a common feed, namely a smaller central radiator R1 for the DCS frequency band and a longer radiator R2, wrapped around the central radiator R1, for the GSM frequency band.

The feeds 12, 14 are on either side of the ground pin 16 and the spaces between the feed and ground pins 12, 14, 16 have been partially filled with a conductive material 42 to leave unfilled gaps G1 and G2, each of the order of 2 mm. The sizes of the gaps could be different on either side of the ground pin 16 in order to optimise independently each band. It can be seen that the feed pin 12 for GSM is wider than the feed pin 14 in order that the common mode impedance transformation is different for both bands.

Other arrangements of the feed pins 12, 14 and the ground pin 16 to that shown in FIG. 2 are possible. For example the ground pin 16 could be offset to one side of the feed pins 12,14.

Due to the conductive material 42 partially filling the spaces between the respective feed pins 12, 14 and the ground pin 16, the PIFA incorporates a low valued shunt inductance across each feed. This inductance is tuned by shunt capacitors 46A, 46B (FIG. 1) on each feed by resonating with it at the resonant frequency of the antenna. Since the feeds are independent, each capacitance can be independently optimised, resulting in more wide band performance for both bands with no compromise required between the two bands. In order to prevent energy from being transferred between the two feeds 12, 14, the antenna is co-designed with the RF front end by the provision of the common coupling stages 26A, 26B.

Reverting to the coupling stages 26A, 26B shown in FIG. 1, apart from one difference in the stage 26B, the architectures of these stages is the same although the component values are selected for the particular frequencies of use and where appropriate the same reference numerals with the suffix A or B have been used to indicate corresponding components in the coupling stages 26A and 26B, respectively.

For convenience the coupling stage 26A will be described and the reference numerals of the corresponding components in the coupling stage 26B will be shown in parentheses. The output of the transmitting stage 24A (24B) is coupled to the anode of a low loss PIN diode D1 (D3), the cathode of which is coupled to one end of a series inductance 48A (48B). The other end of the inductance 48A (48B) is coupled to the feed 12 (14), to the shunt capacitor 46A (46B) and to one end of a quarter wavelength (λ/4) transmission line 50A (50B). The other end of the transmission line 50A (50B) is coupled to the anode of a low loss PIN diode D2 (D4), the cathode of which is coupled to ground, and to an input of a band pass filter 52A (52B). The filters 52A, 52B may comprise SAW filters. The output of the filter 52A (52B) is coupled to the input of the receiver section 28A (28B).

If the filter 52B is implemented as a SAW filter, a RF resonant trap circuit 54 is provided in the signal path from the other end of the transmission line 50B to the input of the band pass filter 52B. The trap circuit comprises a series capacitor 56 and a shunt inductance 58 which is coupled to ground by way of a capacitor 60. The value of the capacitor 60 is selected to tune the inductance 58 so that the voltage at the input to the filter 52B is reduced. Typically such SAW filters can handle in-band signals of up to a power of 13 dBm. However for out-of-band signals a higher power can be delivered to such a filter which is useful as a GSM signal can have a power of up to 30 dBm. In an alternative implementation BAW (Bulk Acoustic Wave) filters may be considered as they exhibit the same out-of-band impedance characteristics to resonant SAW devices and also they do not suffer from the power handling restrictions which apply to SAW filters.

The switching of the PIN diodes D1 to D4 is controlled by the processor 36 in accordance with the following truth table.

|  | D1 | D2 | D3 | D4 |
| --- | --- | --- | --- | --- |
| GSM Tx | On | On | Off | Off |
| GSM Rx | Off | Off | Off | Off |
| DCS Tx | Off | Off | On | On |
| DCS Rx | Off | Off | Off | Off |

In operation when the GSM transmitter is operating and the DCS transmitter is inactive, the PIN diodes D1, D2 are conductive so that the signal is applied to the feed 12. The other end of the transmission line is open circuit with the result that the transmitted signal does not enter the receiver section 28A. A similar situation occurs when the DCS transmitter is operating and the PIN diodes D3, D4 are conductive.

When a GSM signal is being received the PIN diodes D1, D2 are non-conductive, as are the PIN diodes D3, D4. The received signal passes through the transmission line 50A and is passed by the band pass filter 52A to the receiver section 28A. By the feeds 12 and 14 being on the opposite sides of the ground pin 16, the band pass filter 52B appears reflective to the GSM signal thereby attenuating or blocking this signal. Any GSM signal which is present at the input to the band pass filter 52B will in any event be blocked by the filter. The converse is true when a DCS signal is being received by the receiver section 28B.

The dual feed allows independent optimisation and broad band operation in both the GSM and DCS bands. The integrated design of the antenna, matching circuitry and filtering allows a better overall match and efficiency with a simple architecture.

In assessing the performance of the PIFA and the associated coupling stages 26A, 26B, the following assumptions/ simplifications have been made. The PIN diodes are represented by 2 Ω series resistors in the "On" state and 0.25 pF series capacitors in the "Off" state. The antenna efficiency is not included-all power in the antenna is assumed to be radiated. Ideal transmission lines 50A, 50B have been used. All components are assigned Q's of 50 (constant with frequency). This is regarded as being slightly optimistic for inductors and pessimistic for capacitors (dependent on technology, frequency and so forth).

Figure 3:
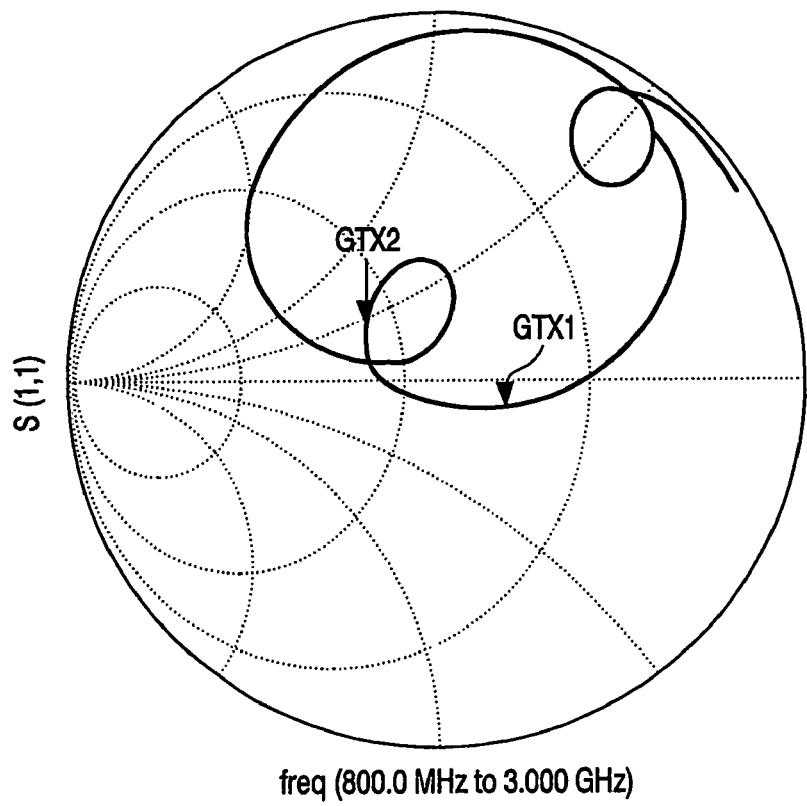
FIG. 3 is a Smith chart showing the performance of the terminal in the GSM transmit mode.
Figure 4:
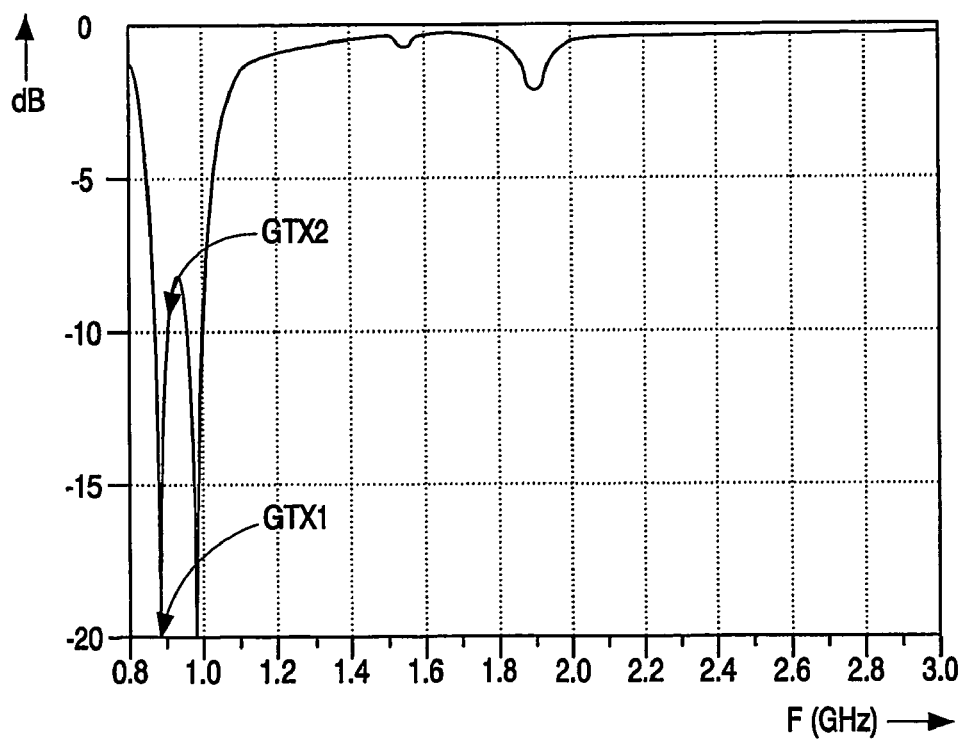
FIG. 4 is a graph showing the simulated return loss $S_{11}$ in dB against frequency in GHz for the GSM transmit mode.
Figure 5:
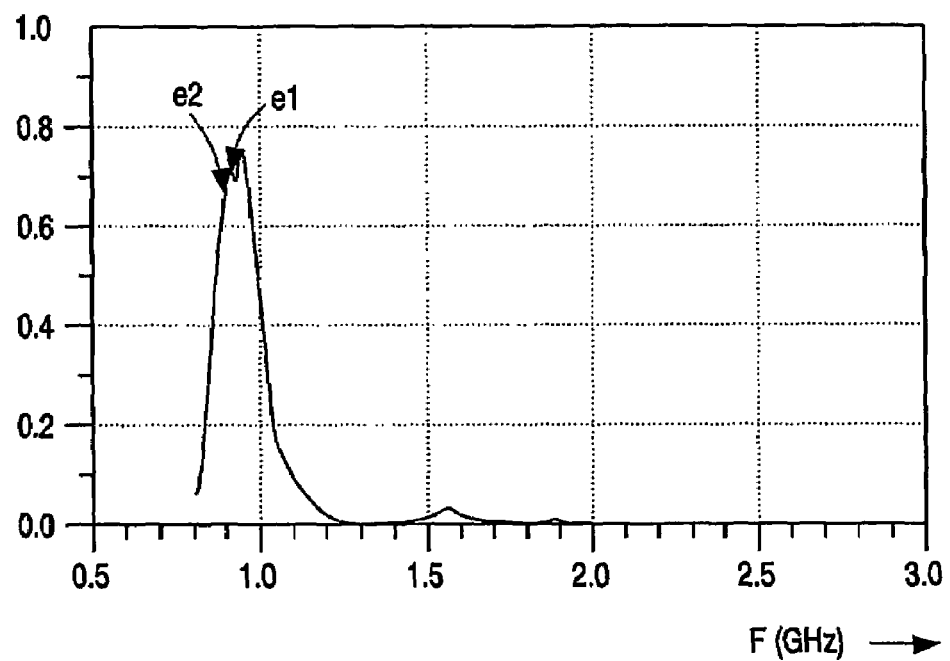
FIG. 5 is a graph showing the total efficiency in the GSM transmit mode.
Figure 6:
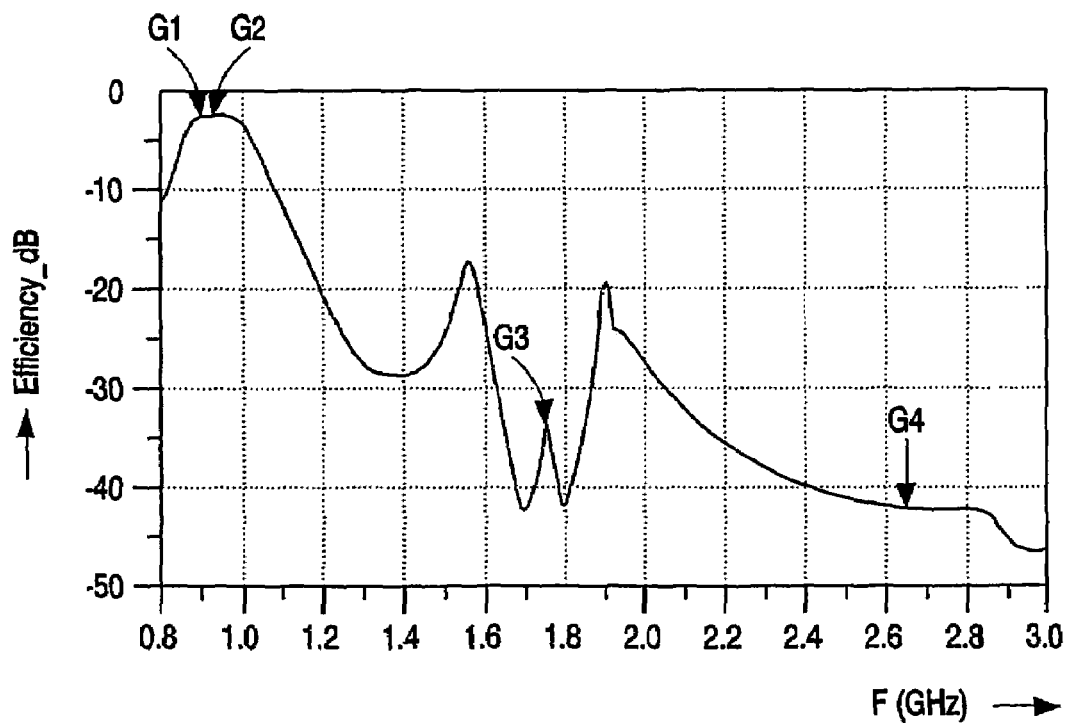
FIG. 6 is a graph showing the GSM transmit out-of-band attenuation.

The performance of the circuit shown in FIG. 1 when operating in the GSM transmit mode is illustrated by in FIG. 3 by a Smith chart and in FIG. 4 by a graph showing the simulated return loss $S_{11}$ in dB against frequency F in GHz. In FIGS. 3 and 4 the arrows GTX1 and GTX2 refer respectively to a frequency/attenuation of 880 MHz/−20.205 dB and 915 MHz/−9.513 dB. Here the antenna is slightly mismatched in order to achieve balanced edge efficiencies as shown in FIG. 5 in which the arrow e1 indicates a frequency of 915 MHz and a total efficiency of 0.710 and the arrow e2 indicates a frequency of 880 MHz and a total efficiency of 0.659. The relatively low efficiency (65%) at 880 MHz is due largely to the Q of the capacitor 46A (FIG. 1) at the GSM input to the antenna. It is felt that this can be improved by using a better quality component and by better optimisation of the antenna impedance. FIG. 6 illustrates the corresponding out-of-band attenuation (mostly provided by the antenna). The arrows G1, G2, G3 and G4 respectively represent the frequency/efficiencies of 880 MHz/−1.812 dB, 915 MHz/−1.490 dB, 1.785 GHz/− 33.627 dB and 2.640 GHz/−42.184 dB. The combination of the antenna and the circuitry provides high levels of second (−33 dB) and third (−42 db) harmonic suppression.

In the DCS transmit mode the PIN diodes D1 and D2 are both "Off" while the PIN diodes D3 and D4 are "On". In this condition the GSM transmitter is isolated predominantly by the PIN diode D1. The GSM receiver SAW filter 52A is isolated predominantly by the antenna 10 being reflective. At the input of the GSM receiver SAW filter 52A the worst case isolation is approximately −26 dB, giving a power of 4 dBm. This is significantly less than the power rating of the SAW filter. The voltage developed is approximately 0.7V which is less than would occur in-band at the maximum power rating. Thus, in the GSM branch a resonant trap is not required.

Figure 7:
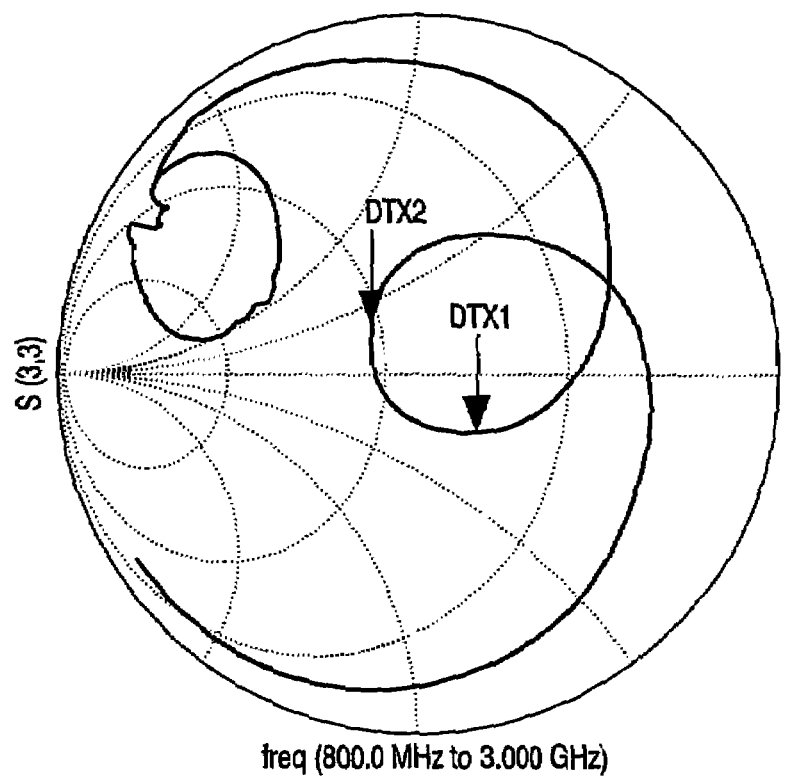
FIG. 7 is a Smith chart showing the performance of the terminal in the DCS transmit mode.
Figure 8:
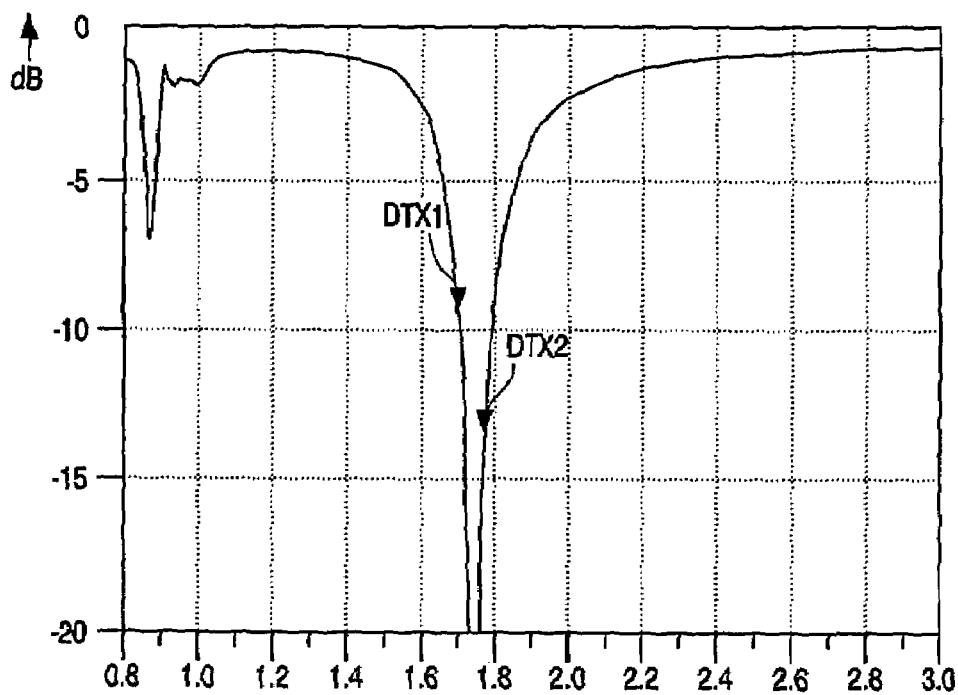
FIG. 8 is a graph showing the simulated return loss $S_{11}$ in dB against frequency in GHz for the DCS transmit mode.
Figure 9:
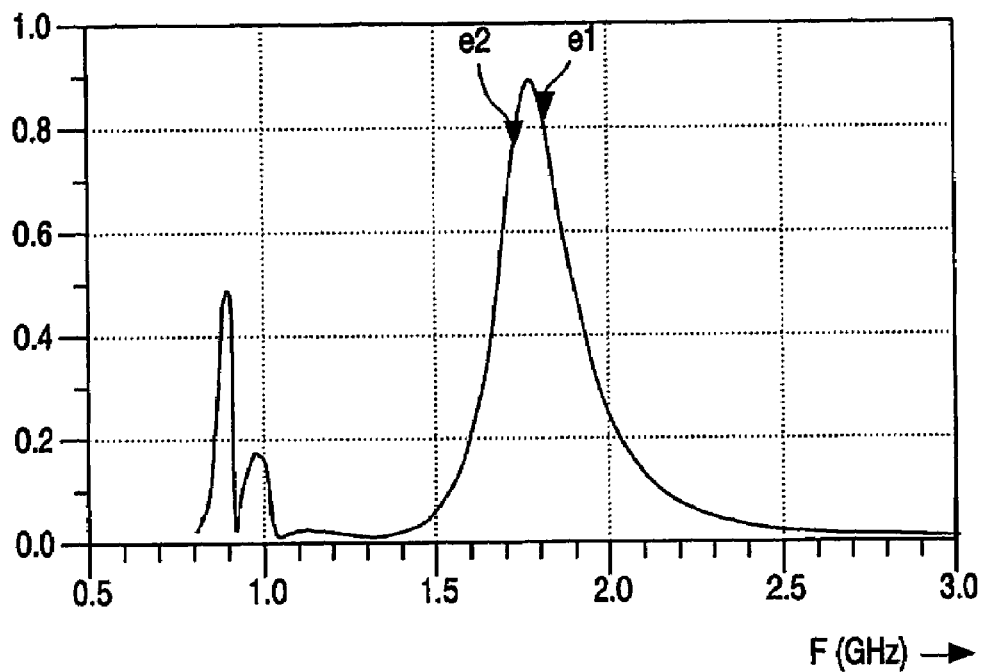
FIG. 9 is a graph showing the total efficiency in the DCS transmit mode.
Figure 10:
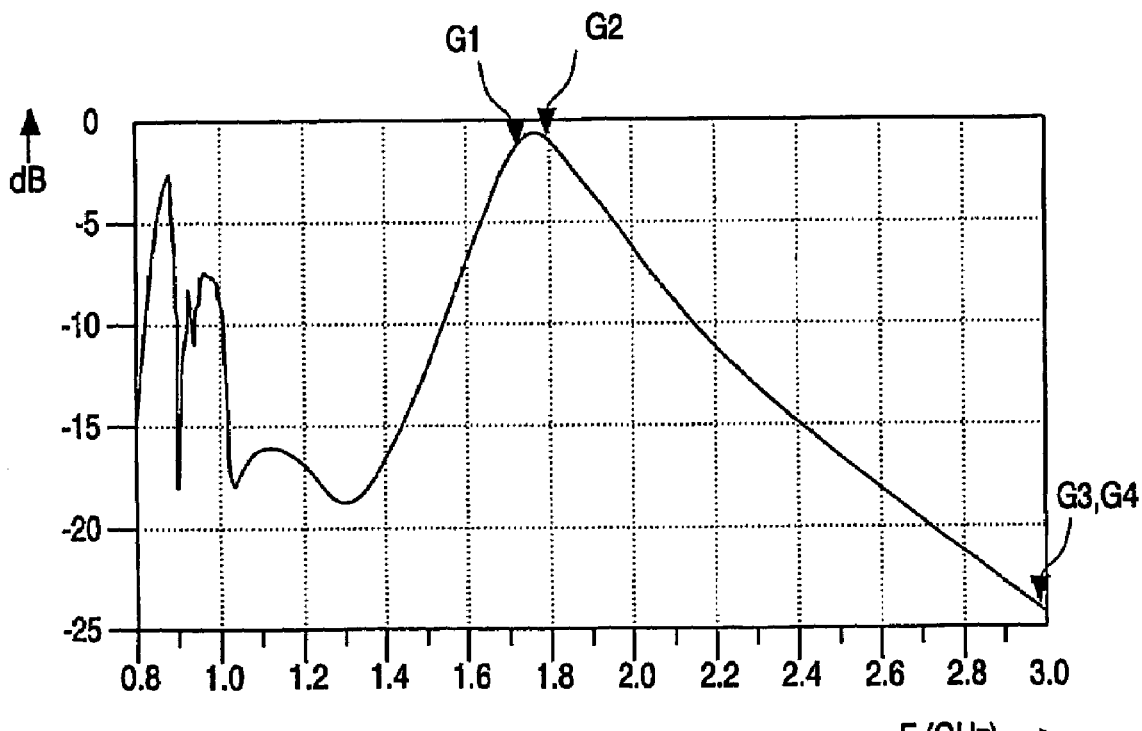
FIG. 10 is a graph showing the DCS transmit out-of-band attenuation.

The performance of the circuit shown in FIG. 1 when operating in the DCS transmit mode is illustrated in FIG. 7 by a Smith chart and in FIG. 8 by a graph showing the simulated return loss $S_{11}$ in dB against frequency F in GHz. In FIGS. 7 and 8 the arrows DTX1 and DTX2 refer respectively to a frequency/attenuation of 1.710 GHz/− 9.532 dB and 1.785 GHz/−13.782 dB. FIG. 9 illustrates optimising the simulated return loss $S_{11}$ for efficiency. In FIG. 9 the arrow e1 indicates a frequency of 1.795 GHz and a total efficiency of 0.823 and the arrow e2 indicates a frequency of 1.710 GHz and a total efficiency of 0.752. The corresponding out-of-band attenuation (mostly provided by the antenna) is shown in FIG. 10. The arrows G1, G2, G3 and G4 respectively represent the frequency/efficiencies of 1.710 GHz/−1.236 dB, 1.795 GHz/−0.844 dB, 3.000 GHz/−24.540 dB and 3.000 GHz/−24.540 dB. It is anticipated that this configuration will provide reasonable levels of second or third harmonic suppression.

Figure 11:
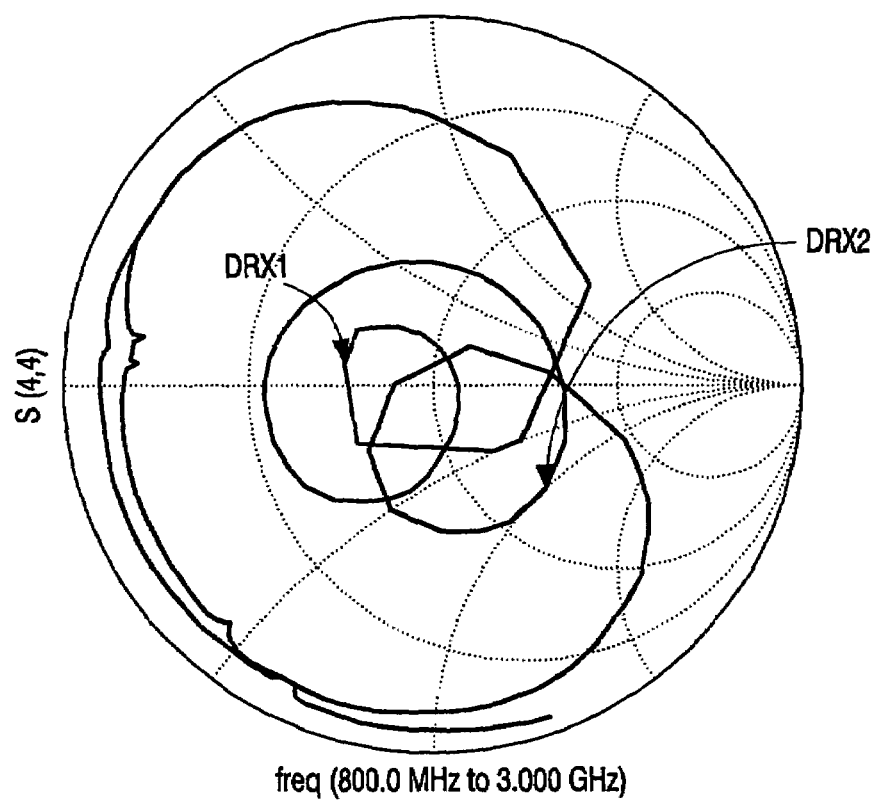
FIG. 11 is a Smith chart showing the performance of the terminal in the DCS receive mode.
Figure 12:
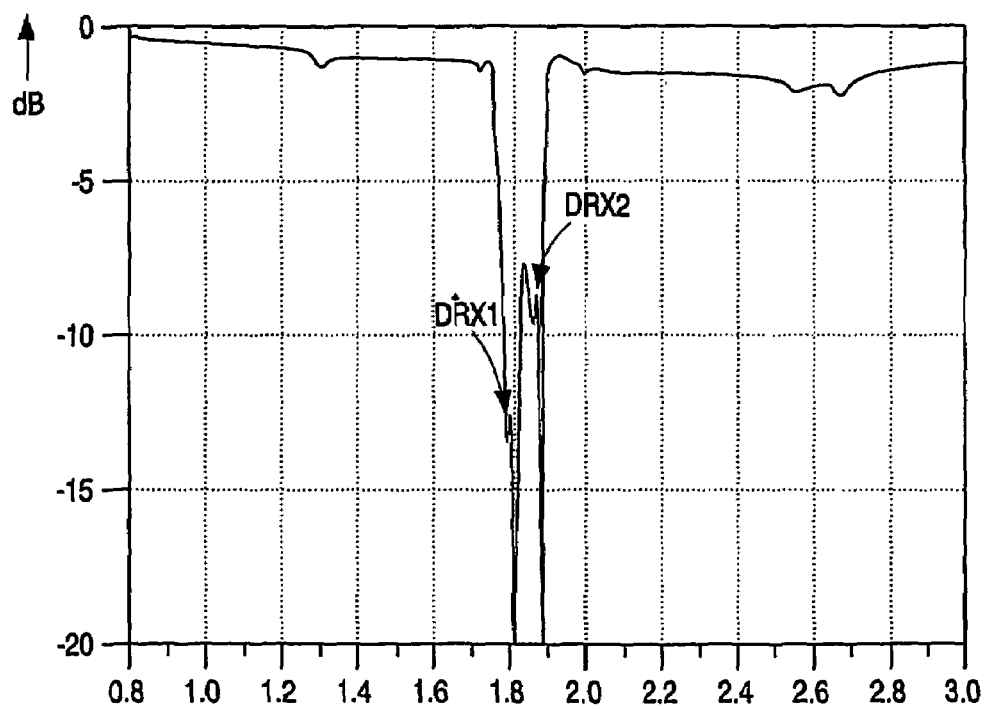
FIG. 12 is a graph showing the simulated return loss $S_{11}$ in dB against frequency in GHz for the DCS receive mode.
Figure 13:
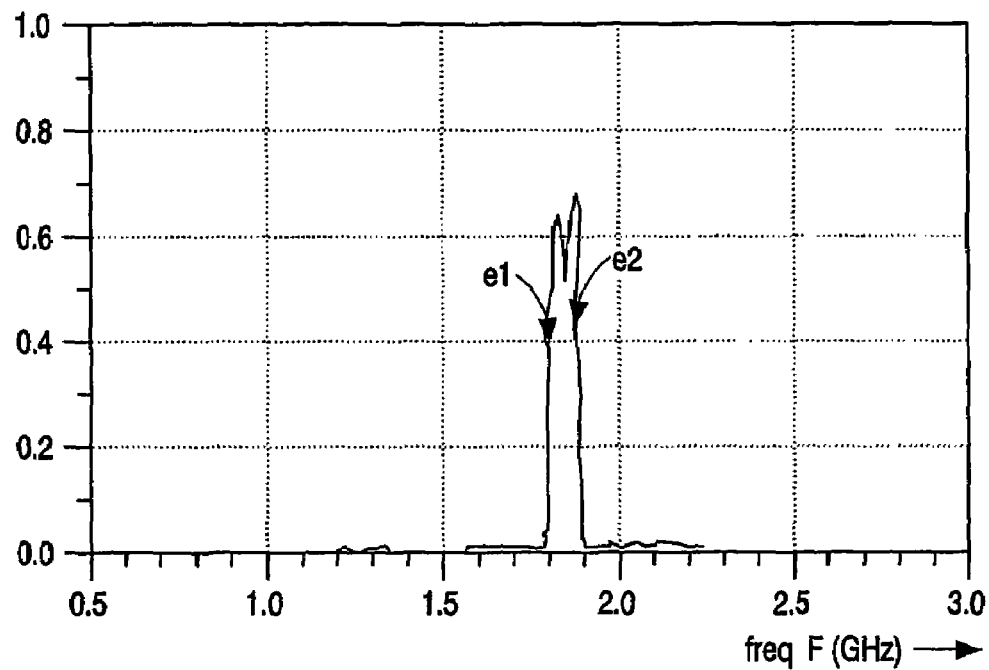
FIG. 13 is a graph showing the total efficiency in the DCS receive mode.

In the DCS receive mode all the PIN diodes are "Off". The performance of the circuit shown in FIG. 1 when operating in the DCS receive mode is illustrated in FIG. 11 by a Smith chart and in FIG. 12 by a graph illustrating the simulated return loss $S_{11}$ in dB against frequency F in GHz. In FIGS. 11 and 12 the arrows DRX1 and DRX2 refer respectively to a frequency/attenuation of 1.805 GHz/−12.743 dB and 1.880 GHz/−7.503 dB. The DCS receive mode efficiency is shown in FIG. 13. In FIG. 13 the arrow e1 indicates a frequency of 1.805 GHz and a total efficiency of 0.405 and the arrow e2 indicates a frequency of 1.880 GHz and a total efficiency of 0.414. The worst case band edge loss in this mode is nearly 4 dB. This is approximately 2 dB higher than for a filter in a 50 Ω system. The additional loss is primarily due to impedance mismatch presented by the antenna and seems sensitive to the impedance (for example, whether the antenna presents an inductive or capacitive load). In a conventional antenna system this mechanism is expected to give significantly more additional loss.

Figure 14:
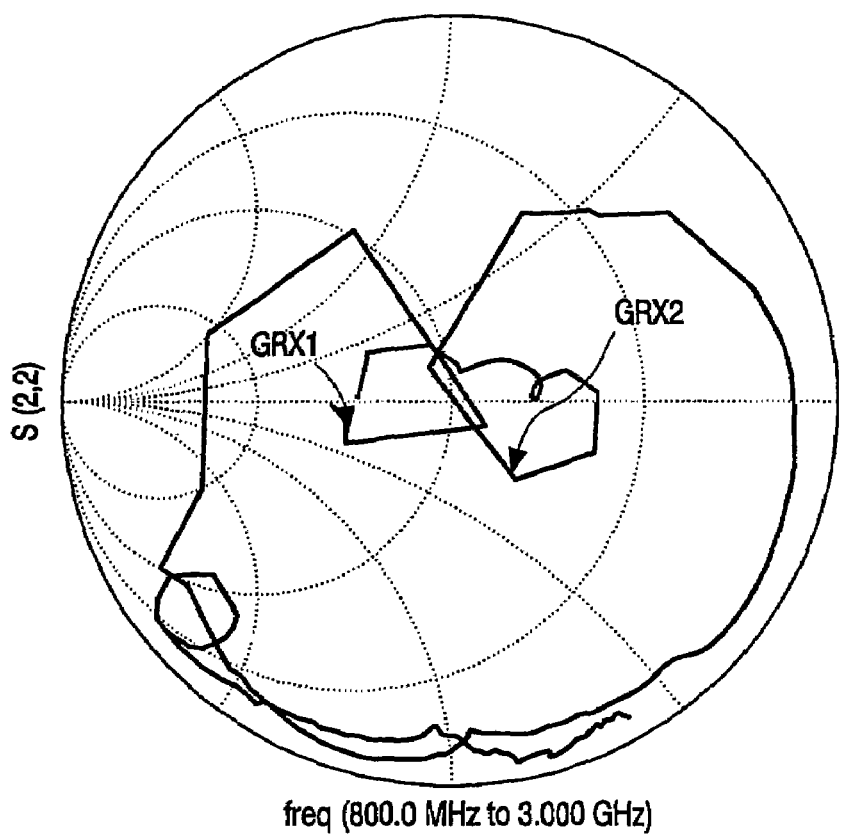
FIG. 14 is a Smith chart showing the performance of the terminal in the GSM receive mode.
Figure 15:
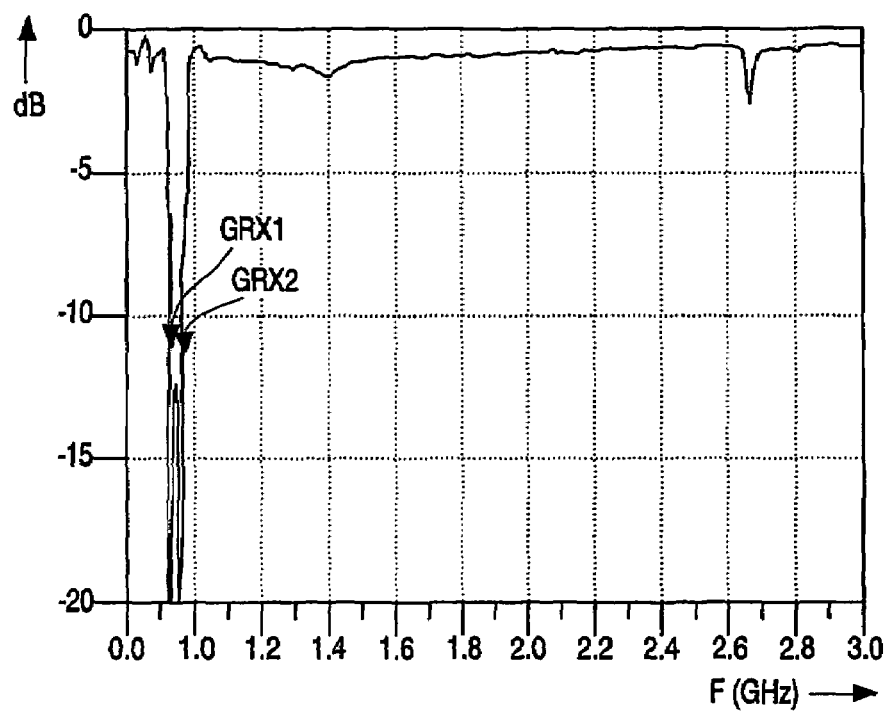
FIG. 15 is a graph showing the simulated return loss $S_{11}$ in dB against frequency in GHz for the GSM receive mode.
Figure 16:
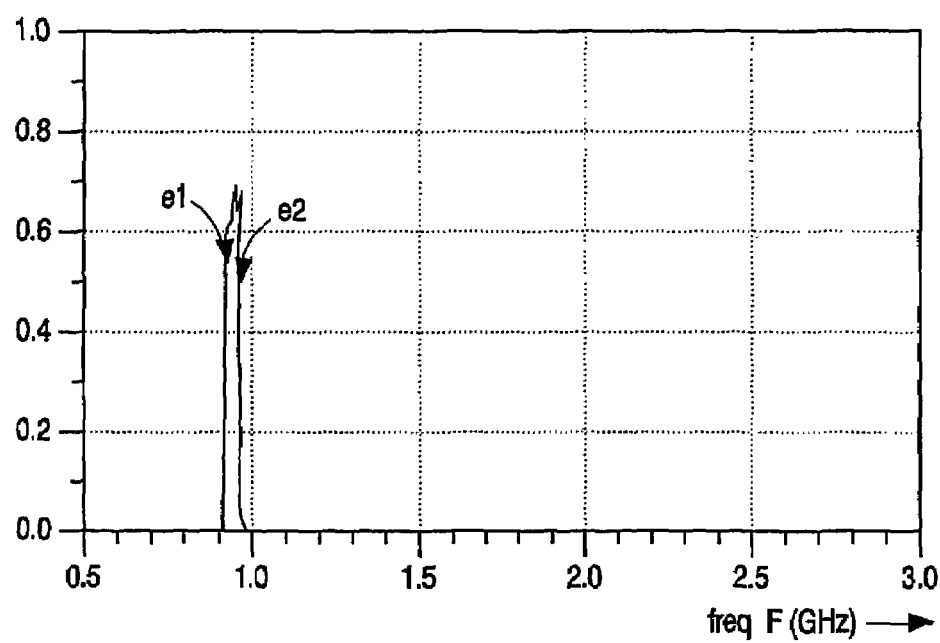
FIG. 16 is a graph showing the total efficiency in the GSM receive mode.

The performance of the circuit shown in FIG. 1 when operating in the GSM receive mode is illustrated in FIG. 14 by a Smith chart and in FIG. 15 by a graph illustrating the simulated return loss $S_{11}$ in dB against frequency F in GHz. In FIGS. 14 and 15 the arrows referenced GRX1 and GRX2 refer respectively to frequencies/attenuations of 925 MHz/−11.298 and 960 MHz/−11.578. FIG. 16 shows the GSM receive mode efficiency, the arrow e1 indicates a frequency of 925 MHz and a total efficiency of 0.496 and the arrow e2 indicates a frequency of 960 MHz and a total efficiency if 0.478.

The performance of the circuit illustrated in FIG. 1 is regarded as being superior to the of a conventional configuration using a diplexer in the following areas:

(1) The total efficiency (including the effects of antenna mismatch) is greater.

(2) The match at the power amplifiers and low noise amplifiers is improved.

(3) The antenna and associated circuitry provide a high degree of harmonic filtering. the filtering requirements of the rest of the module can be reduced if this is taken into consideration.

Points (1) and (2) are regarded as being particularly important. If an RF module is designed without consideration of the antenna, the input match and efficiency will be poor when connected to a typical antenna. Since the RF is contained within the module, there is no opportunity to counter the effects of the antenna at intermediate circuit stages.

Although the present invention has been described with reference to a wireless terminal having a PIFA antenna and operating in the GSM and DCS bands. The invention may be applied to any multiband radio and in other dual band applications. Also the present invention relates to an RF module having an antenna and at least those components included in the coupling stages 26A and 26B.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of wireless terminals and component parts therefor and which may be used instead of or in addition to features already described herein.

INDUSTRIAL APPLICABILITY

Multiband Wireless terminals, for example dual band mobile telephones.

The invention claimed is:

1. A wireless terminal having a dual band antenna arrangement comprising an antenna (10) having a first feed (12) for signals in a first, lower frequency band, a second feed (14) for signals in a second, higher frequency band and a ground pin (16), first coupling means (26A) for coupling transmit and receive paths of a first transceiver to the first feed, second coupling means (26B) for coupling transmit and receive paths of a second transceiver to the second feed, each of the first and second coupling means comprising a quarter wavelength transmission line (50A, 50B) having a first end coupled to the respective transmit signal path and a second end coupled by bandpass filtering means (52A, 52B) to the respective receive signal path, a first switching device (D1, D3) coupling a transmit signal path to the first end of the respective quarter wavelength transmission line, a second switching device (D2, D4) coupling the second end of the respective quarter wavelength transmission line to ground, and means (36) for switching-on the first and second switching devices of one of the first and second coupling means when in a transmit mode and for switching-off the first and second switching devices when in a receive mode, the first and second switching devices of the other of the first and second coupling means being non-conductive.

2. A wireless terminal as claimed in claim 1, characterised in that the antenna is a planar inverted-F antenna.

3. A wireless terminal as claimed in claim 1 or 2, characterised in that the ground pin (16) is disposed between, and insulated from, the first (12) and second (14) feeds.

4. A wireless terminal as claimed in claim 1, 2 or 3, characterised by means (56, 58, 60) for reducing the voltage at a signal input of the band pass filtering means of the second coupling means.

5. A wireless terminal as claimed in any one of claims 1 to 4, characterised in that the first and second switching devices comprise PIN diodes.

6. An RF module for use with a dual band antenna arrangement, the RF module comprising a first antenna feed (12) for signals in a first, lower frequency band, a second antenna feed (14) for signals in a second, higher frequency band and a ground pin (16), first coupling means (26A) for coupling transmit and receive paths of a first transceiver to the first feed, second coupling means (26B) for coupling transmit and receive paths of a second transceiver to the second feed, each of the first and second coupling means comprising a quarter wavelength transmission line (50A, 50B) having a first end coupled to the respective transmit signal path and a second end coupled by band pass filtering means (52A, 52B) to the respective receive signal path, a first switching device (D1, D3) coupling a transmit signal path to the first end of the respective quarter wavelength transmission line, a second switching device (D2, D4)

coupling the second end of the respective quarter wavelength transmission line to ground, and means (36) for switching-on the first and second switching devices of one of the first and second coupling means when in a transmit mode and for switching-off the first and second switching devices when in a receive mode, the first and second switching devices of the other of the first and second coupling means being non-conductive.

7. A RF module as claimed in claim 6, characterised in that the ground pin (16) is disposed between, and insulated from, the first (12) and second (14) feeds.

8. A RF module as claimed in claim 6 or 7, characterised by means (56, 58, 60) for reducing the voltage at a signal input of the band pass filtering means of the second coupling means.

9. The combination of a RF module as claimed in claim 6, 7 or 8, and an antenna (10) having means for connection to the first and second feeds (12, 14) and the ground pin (16).

10. The combination as claimed in claim 9, characterised in that the antenna is a planar inverted-F antenna.

* * * * *